United States Patent
Kwon et al.

(10) Patent No.: US 9,225,346 B2
(45) Date of Patent: Dec. 29, 2015

(54) FILTERING CIRCUIT, PHASE IDENTITY DETERMINATION CIRCUIT AND DELAY LOCKED LOOP

(71) Applicant: SK hynix Inc., Gyeonggi-do (KR)

(72) Inventors: Dae-Han Kwon, Gyeonggi-do (KR);
Yong-Ju Kim, Gyeonggi-do (KR);
Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/159,193

(22) Filed: Jan. 20, 2014

(65) Prior Publication Data
US 2014/0132339 A1    May 15, 2014

(30) Foreign Application Priority Data
Dec. 22, 2011   (KR) .................. 10-2011-0140494

(51) Int. Cl.
*H03L 7/06*   (2006.01)
*H03K 5/00*   (2006.01)
*H03L 7/093*  (2006.01)
*H03L 7/081*  (2006.01)
*H03L 7/23*   (2006.01)

(52) U.S. Cl.
CPC .............. *H03L 7/093* (2013.01); *H03L 7/0812* (2013.01); *H03L 7/235* (2013.01)

(58) Field of Classification Search
CPC ...................................... H03L 7/093
USPC ................... 327/551–559, 147–161
See application file for complete search history.

(56) References Cited

U.S. PATENT DOCUMENTS

| | | | | |
|---|---|---|---|---|
| 4,326,261 | A * | 4/1982 | Peoples ......................... | 708/309 |
| 6,512,414 | B2 * | 1/2003 | Yokoyama et al. ........... | 327/553 |
| 2012/0223850 | A1 * | 9/2012 | Su ................................. | 341/144 |

* cited by examiner

*Primary Examiner* — Dinh Le
(74) *Attorney, Agent, or Firm* — IP & T Group LLP

(57) ABSTRACT

A filtering circuit includes a clock selection unit configured to transfer a first clock or a second clock having a frequency lower than the first clock as an operating clock in response to a frequence signal, and a filter configured to filter an input signal and generate a filtered signal in synchronization with the operating clock.

7 Claims, 3 Drawing Sheets

FILTERING CIRCUIT, PHASE IDENTITY DETERMINATION CIRCUIT AND DELAY LOCKED LOOP

CROSS-REFERENCE TO RELATED APPLICATIONS

This application is a division of U.S. patent application Ser. No. 13/607,234 filed on Sep. 7, 2012, which claims priority of Korean Patent Application No. 10-2011-0140494, filed on Dec. 22, 2011. The disclosure of each of the foregoing application is incorporated herein by reference in its entirety.

BACKGROUND

1. Field

Exemplary embodiments of the present invention relate to a filtering circuit, a phase identity determination circuit and a delay locked loop.

2. Description of the Related Art

A circuit device such as a DDR SDRAM (double data rate synchronous DRAM) performs transmission of various signals and data using an internal clock synchronized with an external clock which is used in an external system. Though a clock inputted to the circuit device is applied initially in a state that it is synchronized with the external clock, it is delayed while passing through various component elements in the device and is not in synchronization with the external clock when it is outputted to an outside of the device. Thus, in order for stable transmission of signals and data, it is to compensate the internal clock for a time taken to load data on a bus in the circuit device such that the outputted internal clock and the external clock are precisely synchronized with each other in the external system. In order to play this role, a delay locked loop is used.

FIG. 1 is a configuration diagram of a conventional delay locked loop.

Referring to FIG. 1, a delay locked loop includes a delay unit 110, a replica delay unit 120, a phase comparison unit 130, a filter unit 140, a lock signal generation unit 150, and a delay value control unit 160.

Operations of the delay locked loop will be described with reference to FIG. 1.

The delay unit 110 delays an input clock ICLK and generates an output clock OCLK. The replica delay unit 120 delays the output clock OCLK by a modeled delay value and generates a feedback clock FBCLK. The phase comparison unit 130 compares the phases of the input clock ICLK and the feedback clock FBCLK. In order to remove noise included in a comparison result PHA of the phase comparison unit 130, the filter unit 140 filters the comparison result PHA of the phase comparison unit 130 and generates a filtered signal FIL. The delay value control unit 160 controls the delay value of the delay unit 110 in response to the filtered signal FIL. The lock signal generation unit 150 activates a lock signal LOCK in response to the filtered signal FIL when the phases of the input clock ICLK and the feedback clock FBCLK become the same with each other. If the lock signal LOCK is activated, the delay value control unit 160 maintains the delay value of the delay unit 110 as the delay value at a time when the lock signal LOCK is activated.

For example, the lock signal generation unit 150 may activate the lock signal LOCK when the phase difference between the input clock ICLK and the feedback clock FBCLK is smaller than a given value. The given value may be a minimum value delayed by the delay unit 110 (hereinafter, referred to as a unit delay value).

The phase comparison unit 130 generates the comparison result PHA of a low level when the phase of the feedback clock FBCLK is earlier than the phase of the input clock ICLK and generates the comparison result PHA of a high level when the phase of the feedback clock FBCLK is later than the phase of the input clock ICLK.

The filter unit 140 samples the output PHA (hereinafter, referred to as the comparison result PHA) of the phase comparison unit 130 in response to an operating clock CLKA. If the number of times the comparison result PHA of the high level is sampled is equal to or greater than a filter depth, the filtered signal FIL of a high level is generated, and if the number of times the comparison result PHA of the low level is sampled is equal to or greater than the filter depth, the filtered signal FIL of a low level is generated. Hereinbelow, explanations will be made for the case that the filter unit 140 updates the logic value of the filtered signal FIL when the comparison result PHA of the same logic value is consecutively sampled by the filter depth. For example, when the filter depth is 5, the filter unit 140 updates the logic value of the filtered signal FIL to the low level when the comparison result PHA of the low level is consecutively sampled 5 times and updates the logic value of the filtered signal FIL to the high level when the comparison result PHA of the high level is consecutively sampled 5 times.

The lock signal generation unit 150 activates the lock signal LOCK when the filtered signal FIL transitions from the low level to the high level. This is because the transition of the filtered signal FIL from the low level to the high level means that the phase difference between the input clock ICLK and the feedback clock FBCLK is smaller than the unit delay value of the delay unit 110.

The delay value control unit 160 increases the delay value of the delay unit 110 when the filtered signal FIL has the low level and decreases the delay value of the delay unit 110 when the filtered signal FIL has the high level. If the lock signal LOCK is activated, the delay value control unit 160 causes the delay unit 110 to maintain a corresponding delay value.

FIG. 2 is a waveform diagram illustrating the features of the conventional delay locked loop.

A half locking phenomenon that the falling edge of the input clock ICLK and the rising edge of the feedback clock FBCLK are locked together due to noise will be described below with reference to FIG. 2.

Due to noise induced by a power drop, etc., the rising edge of the feedback clock FBCLK located at a first position 201 may be moved to a second position 202 while the delay locked loop operates to match the phase of the input clock ICLK and the feedback clock FBCLK. The phase comparison unit 130 generates the comparison result PHA of the low level, and the logic value of the filtered signal FIL is updated to the low level when the comparison result PHA of the low level is consecutively sampled 5 times. The delay value control unit 160 increases the delay value of the delay unit 110 in response to the filtered signal FIL of the low level, by which the rising edge of the feedback clock FBCLK is moved/delayed to a third position 203. Thereafter, if noise is removed, the rising edge of the feedback clock FBCLK is moved to a fourth position 204, and the comparison result PHA of the high level is generated by the phase comparison unit 130. If the comparison result PHA of the high level is consecutively sampled 5 times, the filter unit 140 updates the logic value of the filtered signal FIL to the high level. Since the filtered signal FIL is changed from the low level to the high level, the lock signal generation unit 150 activates the lock signal LOCK. Therefore, the phase of the feedback clock FBCLK is locked at a wrong position.

Such half locking may occur when a period in which noise is generated is longer than the length of filter depth and shorter than two times the length of the filter depth. The length of the filter depth corresponds to the maximum value of the duration of noise which the filter unit 140 may filter. If noise is generated for a shorter period than the length of the filter depth, the filter unit 140 may filter the noise, and if noise is generated is for a longer period than two times the length of the filter depth, the delay value of the delay unit 110 is increased by the delay value control unit 160 and the feedback clock FBCLK goes out of a period in which the half locking may occur. The length of the filter depth is determined by the sampling frequence of the filter unit 140. As the sampling frequence is high, the length of the filter depth is shortened, and as the sampling frequence is low, the length of the filter depth is lengthened. As the length of the filter depth becomes long, the probability of the half locking to occur increases.

SUMMARY

Embodiments of the present invention are directed to a filtering circuit, a phase identity determination circuit and a delay locked loop which have characteristics of being invulnerable to noise and may reduce current consumption and power consumption.

In accordance with an embodiment of the present invention, a filtering circuit includes: a clock selection unit configured to transfer a first clock or a second clock having a frequency lower than the first clock as an operating clock in response to a frequence signal; and a filter configured to filter an input signal and generate a filtered signal in synchronization with the operating clock.

In accordance with another embodiment of the present invention, a delay locked loop includes: a first delay unit configured to delay an input clock and generate an output clock; a second delay unit configured to delay the output clock and generate a feedback clock; a phase comparison unit configured to compare a phase of the input clock and a phase of the feedback clock; a filter unit configured to filter a comparison result of the phase comparison unit with a frequence which is determined by a lock signal, and generate a filtered signal; a lock signal generation unit configured to generate the lock signal in response to the filtered signal; and a delay value control unit configured to control a delay value of the first delay unit in response to the filtered signal and the lock signal.

In accordance with still another embodiment of the present invention, a phase identity determination circuit includes: a phase comparison unit configured to compare a phase of a first input clock and a phase of second input clock; a clock selection unit configured to transfer a first clock or a second clock having a frequency lower than the first clock as an operating clock in response to a frequence signal; a filter configured to filter a comparison result of the phase comparison unit and generate a filtered signal in synchronization with the operating clock; and a signal generation unit configured to generate the frequence signal in response to the filtered signal.

DETAILED DESCRIPTION

Figure 1:
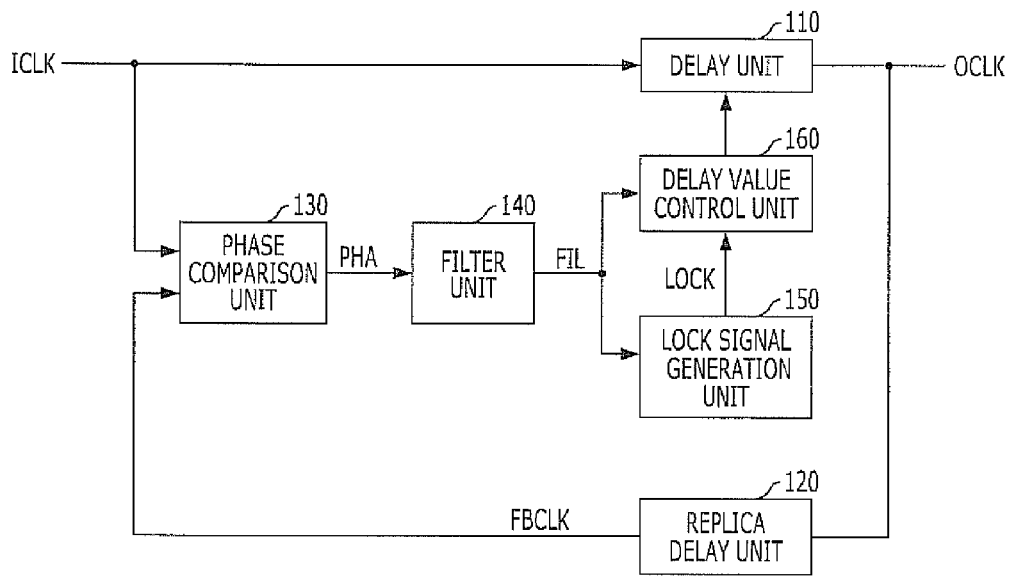
FIG. 1 is a configuration diagram of a conventional delay locked loop.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following descriptions, while a frequence signal LOCK and a lock signal LOCK have different terminologies, they represent the same signals used to select a clock with which a filter is to be synchronized to operate and having the same function of controlling the sampling frequence of the filter. The lock signal LOCK is used in a phase locked loop because it is activated when locking a phase as a phase difference between an input clock ICLK and a feedback clock FBCLK becomes smaller than a given value. Therefore, the two terms are used for distinguishment between embodiments in which the present invention is applied to a phase locked loop and the remaining embodiments.

Figure 3:
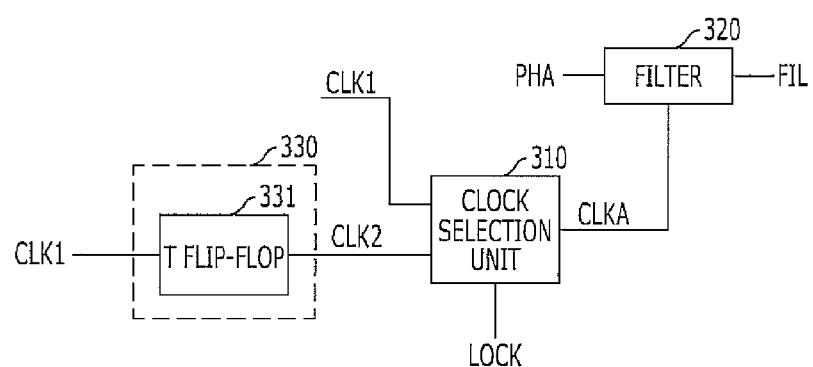
FIG. 3 is a configuration diagram of a filtering circuit in accordance with an embodiment of the present invention.

FIG. 3 is a configuration diagram of a filtering circuit in accordance with an embodiment of the present invention.

Referring to FIG. 3, the filtering circuit includes a clock selection unit 310 configured to transfer a first clock CLK1 or a second clock CLK2 having a frequency lower than the first clock CLK1 as an operating clock CLKA in response to a frequence signal LOCK, a filter 320 configured to operate in synchronization with the operating clock CLKA, filter an input signal PHA and generate a filtered signal FIL, and a clock division unit 330 configured to divide the first clock CLK1 and generate the second clock CLK2.

Operations of the filtering circuit will be described with reference to FIG. 3.

The clock selection unit 310 transfers the first clock CLK1 as the operating clock CLKA when the frequence signal LOCK is deactivated and transfers the second clock CLK2 as the operating clock CLKA when the frequence signal LOCK is activated. The frequency of the second clock CLK2 is lower than the first clock CLK1.

The filter 320 samples the input signal PHA in synchronization with the operating clock CLKA, filters the sampled input signal PHA and generates the filtered signal FIL. The filter 320 samples the input signal PHA in synchronization with the first clock CLK1 when the frequence signal LOCK is deactivated and samples the input signal PHA in synchronization with the second clock CLK2 when the frequence signal LOCK is activated. Since the frequency of the second clock CLK2 is lower than the frequency of the first clock CLK1, the filter 320 samples the input signal PHA at a high frequency when the filter 320 samples the input signal PHA in synchronization with the first clock CLK1 (hereinafter, referred to as a high frequence mode), and the filter 320 samples the input signal PHA at a low frequency when the filter 320 samples the input signal PHA in synchronization with the second clock CLK2 (hereinafter, referred to as a low frequence mode).

The filtering ability of the filter 320 may be defined by a filter depth and the length of the filter depth.

In a proportional type filter, when the input signal PHA of a first value (for example, a low level) is consecutively sampled at least a first critical number of times, the logic value of the filtered signal FIL is updated to a first logic value (for example, a low level) corresponding to the first value, and when the input signal PHA of a second value (for example, a high level) is consecutively sampled at least a second critical number of times, the logic value of the filtered signal FIL is updated to a second logic value (for example, a high level) corresponding to the second value. The first critical number of times and the second critical number of times correspond to the filter depth. The length of the filter depth corresponds to a value acquired by multiplying the filter depth by a sampling period.

Therefore, if the filter 320 is the proportional type filter and the filtered signal FIL is updated to the low level when the input signal PHA of the low level is consecutively sampled 5 times and to the high level when the input signal PHA of the high level is consecutively sampled 5 times, the filter depth may be defined as 5. If the filter 320 operates in synchronization with the operating clock CLKA having the frequency of 1 Hz, the sampling period is 1 second, and the length of the filter depth becomes 5 seconds. Such a filter 320 may perform filtering even when noise is consecutively sampled up to 4 times and may filter noise which continues for a period shorter than 5 seconds.

That is to say, the filter depth corresponds to the maximum value of the number of consecutive sampling times of noise which may be filtered by the filter 320, and the length of the filter depth corresponds to the maximum value of the duration of noise which may be filtered by the filter 320.

In the case of the high frequence mode, while it is appropriate for a high speed operation, since the states of signals in the circuit frequently transitions due to the high speed operation, current consumption and power consumption may increase. The low frequence mode has opposite characteristics to the high frequence mode. In other words, in the low frequence mode, while it is not appropriate for a high speed operation, current consumption and power consumption may decrease.

In an integrated type filter, when the number of times the input signal PHA of a first value (for example, a low level) is sampled is greater by a first critical number of times than the number of times the input signal PHA of a second value (for example, a high level) is sampled, the logic value of the filtered signal FIL is updated to a first logic value (for example, a low level) corresponding to the first value, and when the number of times the input signal PHA of the second value is sampled is greater by a second critical number of times than the number of times the input signal PHA of the first value is sampled, the logic value of the filtered signal FIL is updated to a second logic value (for example, a high level) corresponding to the second value. The first critical number of times and the second critical number of times correspond to the filter depth.

Therefore, if the filter 320 is the integrated type filter, the recently sampled input signal PHA continues to be accumulated and the filtered signal FIL is updated when a difference between the number of sampling times of the input signal PHA having the low level and the number of sampling times of the input signal PHA having the high level corresponds to 5, the filter depth may be defined as 5.

For reference, the clock division unit 330 may include at least one T flip-flop 331. The T flip-flop 331 divides its input clock by two and generates an output clock. Therefore, the second clock CLK2 may be generated through dividing the first clock CLK1 by $2^N$ by serially connecting N number of T flip-flops. However, the filtering circuit shown in FIG. 3 may not include the clock division unit 330. The first clock CLK1 and the second clock CLK2 as clocks having different frequencies (the frequency of the second clock CLK2 is lower than the frequency of the first clock CLK1) may be applied from an outside of the filtering circuit.

The filtering circuit according to the present invention may operate under a high frequence mode or a low frequence mode depending upon a situation by changing the frequency of the operating clock CLKA of the filter 320 in response to an operation condition, and thereby, it may take advantages of both the high frequence mode and the low frequence mode. Namely, it may lead to not only a high speed operation, but also a reduction in current consumption and power consumption.

Figure 4:
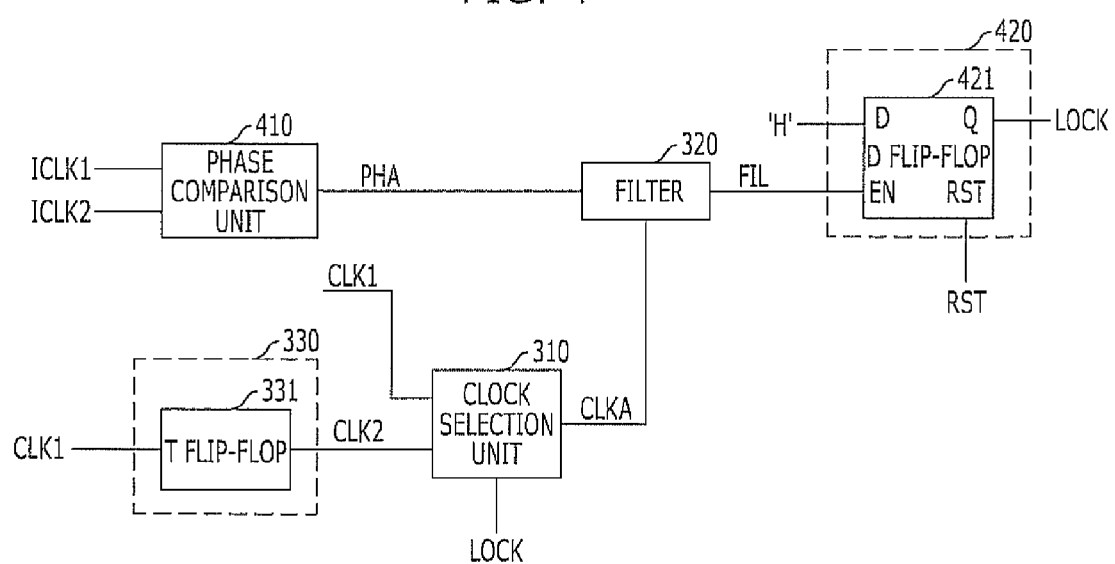
FIG. 4 is a configuration diagram of a phase identity determination circuit in accordance with another embodiment of the present invention.

FIG. 4 is a configuration diagram of a phase identity determination circuit in accordance with another embodiment of the present invention. The phase identity determination circuit of FIG. 4 performs an operation for determining whether the phases of two input clocks ICLK1 and ICLK2 are the same with each other, and it includes the filtering circuit of FIG. 3. The fact that the phases of the two input clocks ICLK1 and ICLK2 are the same with each other means not only the case that the phases of the two input clocks ICLK1 and ICLK2 are accurately the same with each other but also the case that the phase difference between the two input clocks ICLK1 and ICLK2 is smaller than a given value.

The phase identity determination circuit includes a phase comparison unit 410 configured to compare the phase of the first input clock ICLK1 to the phase of the second input clock ICLK2, a clock selection unit 310 configured to transfer a first clock CLK1 or a second clock CLK2 having a frequency lower than the first clock CLK1 as an operating clock CLKA in response to a frequence signal LOCK, a filter 320 configured to operate in synchronization with the operating clock CLKA, filter a comparison result PHA of the phase comparison result 410 and generate a filtered signal FIL, a signal generation unit 420 configured to generate the frequence signal LOCK in response to the filtered signal FIL, and a clock division unit 330 configured to divide the first clock CLK1 and generate the second clock CLK2.

The phase comparison unit 410 compares the phases of the first input clock ICLK1 and the second input clock ICLK2 and outputs the comparison result PHA. The phase comparison unit 410 may output the comparison result PHA of a low level when the phase of the second input clock ICLK2 is earlier than the phase of the first input clock ICLK1 and the comparison result PHA of a high level when the phase of the second input clock ICLK2 is later than the phase of the first input clock ICLK1. This may be changed for design purposes. In the event that the phases of the first input clock ICLK1 and the second input clock ICLK2 are different from each other, the phase of the first input clock ICLK1 or the phase of the second input clock ICLK2 may be changed by a variable delay line (not shown).

The clock selection unit 310, the filter 320 and the clock division unit 330 operate in the same manner as described above with reference to FIG. 3. The comparison result PHA corresponds to the above-described input signal PHA, and the frequence signal LOCK corresponds to the above-described frequence signal LOCK. That is to say, a filter block (including the clock selection unit 310, the filter 320 and the clock division unit 330) of FIG. 4 samples the comparison result PHA with a frequence determined by the frequence signal LOCK, filters the sampled comparison result and generates the filtered signal FIL.

The signal generation unit 420 activates the frequence signal LOCK when the phases of the first input clock ICLK1 and the second input clock ICLK2 become the same with each other, in response to the filtered signal FIL. For this operation, the signal generation unit 420 activates the frequence signal LOCK when the logic value of the filtered signal FIL transitions. FIG. 4 shows an embodiment of the signal generation unit 420 which activates the frequence signal LOCK in the case that the filtered signal FIL transitions from a low level to a high level. The signal generation unit 420 includes a D flip-flop 421. The D flip-flop 421 is inputted with the filtered signal FIL through an enable terminal EN, receives a high level signal through an input terminal D and stores the signal when the filtered signal FIL transitions from the low level to the high level, and outputs the signal through an output terminal Q. The signal outputted through the output terminal Q of the D flip-flop 421 is the frequence signal LOCK, and the activation level of the frequence signal LOCK is the high level. For reference, in the case that the frequence signal LOCK is to be deactivated as the phases of the first input clock ICLK1 and the second input clock ICLK2 mismatch with each other, a reset signal RST inputted through a reset terminal RST is activated, by which the frequence signal LOCK is deactivated to a low level.

The activation level of the frequence signal LOCK or the activation condition of the frequence signal LOCK may be changed for design purposes. For example, design may be made such that the frequence signal LOCK is activated when the phase of the filtered signal FIL transitions from the high level to the low level or the activation level of the frequence signal LOCK becomes the low level.

The phase identity determination circuit according to the embodiment of the present invention has the same effects as the filter circuit according to the aforementioned embodiment of the present invention.

Figure 5:
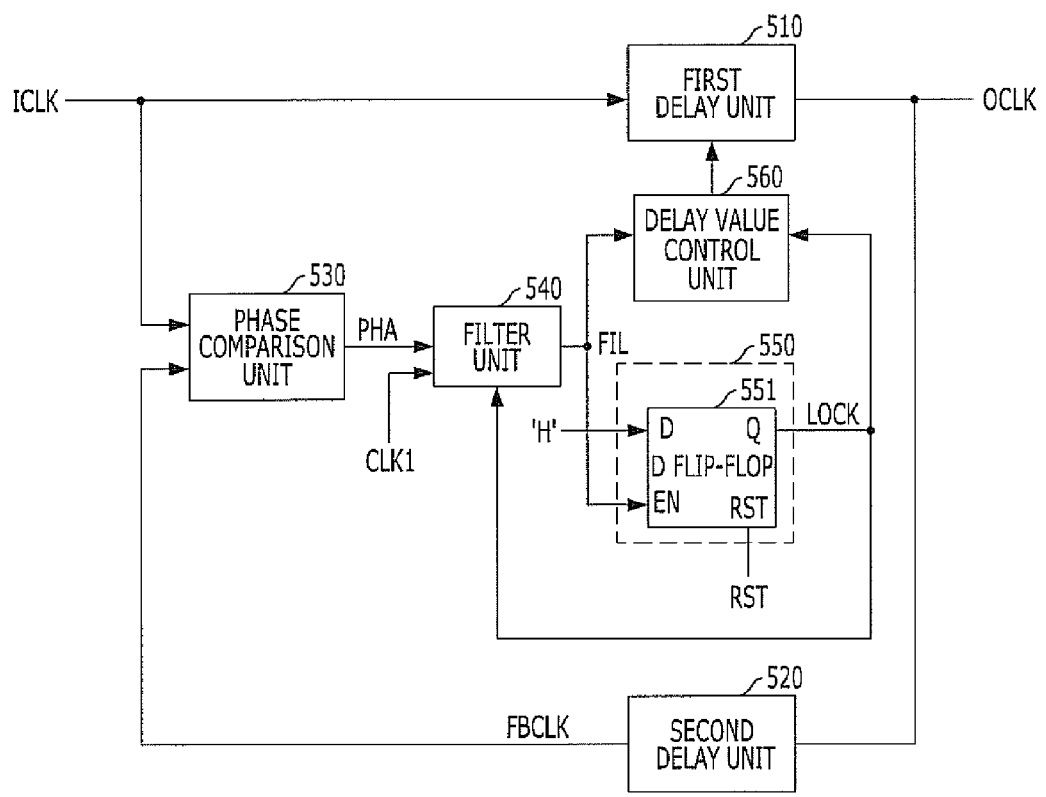
FIG. 5 is a configuration diagram of a delay locked loop in accordance with still another embodiment of the present invention.

FIG. 5 is a configuration diagram of a delay locked loop in accordance with still another embodiment of the present invention. The delay locked loop of FIG. 5 includes the filtering circuit shown in FIG. 3.

Referring to FIG. 5, the delay locked loop includes a first delay unit 510 configured to delay an input clock ICLK and generate an output clock OCLK, a second delay unit 520 configured to delay the output clock OCLK and generate a feedback clock FBCLK, a phase comparison unit 530 configured to compare the phase of the input clock ICLK to the phase of the feedback clock FBCLK, a filter unit 540 configured to filter a comparison result PHA of the phase comparison unit 530 with a frequence determined by a lock signal LOCK and generate a filtered signal FIL, a lock signal generation unit 550 configured to generate the lock signal LOCK in response to the filtered signal FIL, and a delay value control unit 560 configured to control the delay value of the first delay unit 510 in response to the filtered signal FIL and make the first delay 510 unit maintain the delay value when the lock signal LOCK is activated.

The delay locked loop according to the present embodiment of the invention will be described with reference to FIGS. 3 and 5.

The first delay unit 510 delays the input clock ICLK and generates the output clock OCLK. The delay value of the first delay unit 510 is controlled by the delay value control unit 560. The delay value of the first delay unit 510 may be controlled by a given unit delay value at each time.

The second delay unit 520 delays the output clock OCLK and generates the feedback clock FBCLK. The second delay unit 520 has a delay value acquired by modeling delay elements through which the output clock OCLK outputted from the delay locked loop is to pass in a chip (system). In other words, the second delay unit 520 may be a replica delay unit.

The phase comparison unit 530 compares the input clock ICLK and the feedback clock FBCLK and generates the comparison result PHA which indicates the phase relationship between the input clock ICLK and the feedback clock FBCLK. In detail, the phase comparison unit 530 generates the comparison result PHA of a low level if the phase of the feedback clock FBCLK is earlier than the input clock ICLK and the comparison result PHA of a high level if the phase of the feedback clock FBCLK is later than the input clock ICLK. The logic value of the comparison result PHA depending on the phase relationship between the input clock ICLK and the feedback clock FBCLK may be changed design purposes.

The filter unit 540 has the same configuration and operates in the same manner as the filtering circuit of FIG. 3. Thus, the filter unit 540 will be described with reference back to FIG. 3. The filter unit 540 operates in synchronization with a first clock CLK1 when the lock signal LOCK is deactivated and operates in synchronization with a second clock CLK2 having a frequency lower than the first clock CLK1 when the lock signal LOCK is activated. The filter unit 540 samples the comparison result PHA at the frequency determined depending on the frequency of a clock which the filter unit 540 operates in synchronization with. Hence, the filter unit 540 samples the comparison result PHA of the phase comparison unit 530 at a lower frequency when the lock signal LOCK is deactivated than when the lock signal LOCK is activated.

For this operation, the filter unit 540 includes a clock selection unit 310 configured to transfer the first clock CLK1 or the second clock CLK2 as an operating clock CLKA in response to the lock signal LOCK, a filter 320 configured to operate in synchronization with the operating clock CLKA, filter the comparison result PHA of the phase comparison unit 530 and generate the filtered signal FIL, and a clock division unit 330 configured to divide the first clock CLK1 and generate the second clock CLK2. Detailed operations of the clock selection unit 310, the filter 320 and the clock division unit 330 are the same as those described above with reference to FIG. 3. The lock signal LOCK corresponds to the above-described frequence signal LOCK, and the comparison result PHA corresponds to the above-described input signal PHA.

For reference, while it was described with reference to FIG. 5 that the filter unit 540 includes the clock division unit 330, it is to be noted that the filter unit 540 may not include the clock division unit 330 and may only include the clock selection unit 310 and the filter 320. While the filter unit 540 receives, for example, only the first clock CLK1 from an outside and internally generates the second clock CLK2 in the case that the filter unit 540 includes the clock division unit 330, the filter unit 540 may receive the first clock CLK1 and the second clock CLK2 from an outside in the case that the filter unit 540 does not include the clock division unit 330.

The lock signal generation unit 550 activates the lock signal LOCK when the phases of the input clock ICLK and the feedback clock FBCLK become the same with each other, in response to the filtered signal FIL. For this operation, the lock signal generation unit 550 activates the lock signal LOCK when the logic value of the filtered signal FIL transitions. FIG. 5 shows an exemplary embodiment of the lock signal generation unit 550 which activates the lock signal LOCK when the filtered signal transitions from a low level to a high level. The lock signal generation unit 550 includes a D flip-flop 551. The D flip-flop 551 is inputted with the filtered signal FIL through an enable terminal EN, receives a high level signal through an input terminal D and stores the signal when the filtered signal FIL transitions from the low level to the high level, and outputs the signal through an output terminal Q. The signal outputted through the output terminal Q of the D flip-flop 551 is the lock signal LOCK, and the activation level of the lock signal LOCK in the embodiment shown in FIG. 5 is the high level.

For reference, in the case that an operation for matching the phases of the input clock ICLK and the feedback clock FBCLK is to be performed in the delay locked loop as the phases of the input clock ICLK and the feedback clock FBCLK mismatch with each other, a reset signal RST inputted through a reset terminal RST is activated, by which the lock signal LOCK is deactivated to a low level. Moreover, the reason why the transition of the filtered signal FIL from the low level to the high level indicates that the phases of the input clock ICLK and the feedback clock FBCLK are the same with each other is as follows. In general, the delay value of the first delay unit 510 is designed to have a minimum value or to allow the phase of the feedback clock FBCLK to be earlier than the phase of the input clock ICLK, when the delay locked loop starts to operate. Accordingly, the filtered signal FIL starts with the low level. Thereafter, when the filtered signal FIL transitions from the low level to the high level while increasing the delay value of the first delay unit 510 in response to the filtered signal FIL, the phase difference between the input clock ICLK and the feedback clock FBCLK is smaller than a unit delay value, thereby activating the lock signal LOCK.

The activation level of the lock signal LOCK or the activation condition of the lock signal LOCK may be changed for different designs. For example, design may be made such that the lock signal LOCK is activated in the case that the phase of the filtered signal FIL transitions from the high level to the low level or the activation level of the lock signal LOCK becomes the low level.

The delay value control unit 560 increases or decreases the delay value of the first delay unit 510 in response to the filtered signal FIL. In detail, in the above-described example, when the filtered signal FIL has the low level, the delay value control unit 560 increases the delay value of the first delay unit 510 since the phase of the feedback clock FBCLK is earlier than the input clock ICLK, and when the filtered signal FIL has the high level, the delay value control unit 560 decreases the delay value of the first delay unit 510 since the phase of the feedback clock FBCLK is later than the input clock ICLK. If the lock signal LOCK is activated, since the phases of the input clock ICLK and the feedback clock FBCLK are the same with each other, the first delay unit 510 is allowed to maintain a corresponding delay value.

In the delay locked loop according to the present embodiment of the invention, depending upon whether the phases of the input clock ICLK and the feedback clock FBCLK become the same with each other (whether the lock signal LOCK is activated), the frequency of a clock which the filter unit 540 operates in synchronization with is changed.

The filter unit 540 operates in the high frequence mode described above with reference to FIG. 3 when the lock signal LOCK is not activated. Therefore, before the phases of the input clock ICLK and the feedback clock FBCLK become the same with each other, the sampling frequency of the comparison result PHA by the filter unit 540 is increased so that the update of the filtered signal FIL and delay value control may be quickly carried out. The half locking may be prevented from occurring in the case that the filter unit 540 operates under the high frequence mode. The reason to this is as set forth below.

Figure 2:
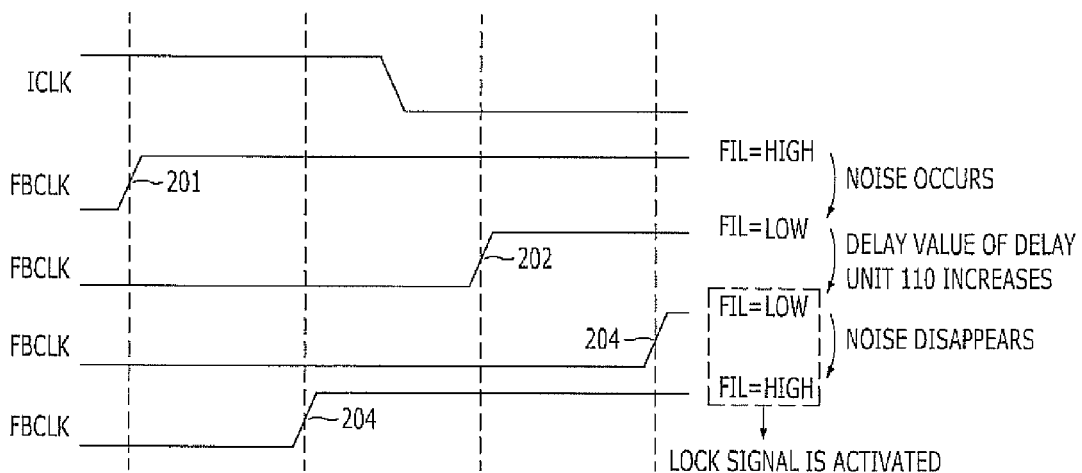
FIG. 2 is a waveform diagram illustrating the features of the conventional delay locked loop.

As aforementioned with reference to FIG. 2, half locking occurs when a period in which noise is generated is longer than the length of filter depth and shorter than two times the length of the filter depth. Thus, if the length of filter depth is lengthened, the range of a period in which the half locking may occur is widened. Conversely, if the length of the filter depth is shortened, since the range of a period in which the half locking may occur is narrowed, the probability of the half locking to occur decreases. As described above with reference to FIG. 3, the length of the filter depth is determined depending upon the frequency of the clock which the filter 320 operates in synchronization with (the sampling frequence of the filter 320). If the frequency of the clock which the filter 320 operates in synchronization with increases (the sampling frequence of the filter 320 increases), since the length of the filter depth is shortened, the probability of the half locking to occur decreases.

Next, the filter unit 540 operates in the low frequence mode described above with reference to FIG. 3 when the lock signal LOCK is activated. After the lock signal LOCK is activated, the filter unit 540 may not operate as promptly as before because the half locking no longer occurs and is not an issue. If the filter unit 540 operates in the low frequence mode, since transition in the states of signals, etc. in the circuit decreases when compared to the high frequence mode, a current consumption and power consumption may be reduced.

As a consequence, in the delay locked loop according to the present embodiment of the invention, prompt phase control is achieved and the probability of the half locking to occur decreases before the lock signal LOCK is activated and current consumption and power consumption may be reduced after the lock signal LOCK is activated, when compared to before the lock signal LOCK is activated.

As apparent from the above descriptions, according to the embodiments of the present invention, a filtering circuit, a phase identity determination circuit and a delay locked loop may have characteristics of being invulnerable to noise, and the current consumption and the power consumption of the filtering circuit, the phase identity determination circuit and the delay locked loop may be reduced.

While the present invention has been described with respect to the specific embodiments, it will be apparent to those skilled in the art that various changes and modifications may be made without departing from the spirit and scope of the invention as defined in the following claims.

What is claimed is:

1. A filtering circuit comprising:
   a clock selection unit configured to receive a first clock and a second clock having a frequency lower than the first clock, and transfer the first clock or the second clock as an operating clock in response to a frequence signal; and
   a filter configured to filter an input signal and generate a filtered signal in synchronization with the operating clock,
   wherein the filter is configured to sample the input signal in synchronization with the operating clock, and
   wherein, when the second clock is transferred as the operating clock, the filter samples the input signal at a lower frequency than when the first clock is transferred as the operating clock.

2. The filtering circuit of claim 1, wherein, when the input signal of a first value is consecutively sampled at least a first critical number of times, the filter updates a logic value of the filtered signal to a first logic value corresponding to the first value, and, when the input signal of a second value is consecutively sampled at least a second critical number of times, the filter updates the logic value of the filtered signal to a second logic value corresponding to the second value.

3. The filtering circuit of claim 1, wherein, when the number of times for the input signal of a first value being sampled is greater by a first critical number of times than the number of times for the input signal of a second value being sampled, the filter updates a logic value of the filtered signal to a first logic value corresponding to the first value, and, when the number of times for the input signal of the second value being sampled is greater by a second critical number of times than the number of times for the input signal of the first value being sampled, the filter updates the logic value of the filtered signal to a second logic value corresponding to the second value.

4. The filtering circuit of claim 1, further comprising:
a clock division unit configured to divide the first clock and generate the second clock.

5. A phase identity determination circuit comprising:
a phase comparison unit configured to compare a phase of a first input clock to a phase of a second input clock;
a clock selection unit configured to receive a first clock and a second clock having a frequency lower than the first clock, and transfer the first clock or the second clock as an operating clock in response to a frequence signal;
a filter configured to filter a comparison result of the phase comparison unit and generate a filtered signal in synchronization with the operating clock; and
a signal generation unit configured to generate the frequence signal in response to the filtered signal,
wherein the filter is configured to sample the comparison result of the phase comparison unit in synchronization with the operating clock, and
wherein, when the second clock is transferred as the operating clock, the filter samples the comparison result of the phase comparison unit at a lower frequency than when the first clock is transferred as the operating clock.

6. The phase identity determination circuit of claim 5, further comprising:
a clock division unit configured to divide the first clock and generate the second clock.

7. The delay locked loop of claim 5, wherein the signal generation unit is configured to activate the frequence signal when a phase difference between the first and second input clocks is smaller than a set value.

* * * * *